United States Patent
Duffin et al.

(10) Patent No.: US 7,177,716 B2
(45) Date of Patent: Feb. 13, 2007

(54) METHODS AND APPARATUS FOR MATERIAL CONTROL SYSTEM INTERFACE

(75) Inventors: David C. Duffin, Sandy, UT (US); Daniel R. Jessop, Eagle Mountain, UT (US); Michael Teferra, Los Gatos, CA (US); Amitabh Puri, San Jose, CA (US); Glade L. Warner, Sandy, UT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/067,311

(22) Filed: Feb. 25, 2005

(65) Prior Publication Data

US 2005/0273190 A1    Dec. 8, 2005

Related U.S. Application Data

(60) Provisional application No. 60/548,588, filed on Feb. 28, 2004.

(51) Int. Cl.
*G06F 19/00* (2006.01)
*B65H 1/00* (2006.01)

(52) U.S. Cl. .............. 700/112; 700/101; 700/115; 700/121; 700/228; 414/222.01

(58) Field of Classification Search ............. 700/96, 700/99–101, 112, 113, 117, 121, 169, 213–217, 700/228–230, 115; 198/345.1; 414/222.01, 414/788, 799, 798.2, 798.9, 800–802, 807–810, 414/812–814

See application file for complete search history.

(56) References Cited

U.S. PATENT DOCUMENTS 3,845,286 A    10/1974    Aronstein et al.
3,952,388 A *  4/1976    Hasegawa et al. .......... 29/33 P
4,027,246 A    5/1977    Caccoma et al.
4,166,527 A    9/1979    Beezer (Continued)

FOREIGN PATENT DOCUMENTS

DE    19715974 A1    10/1998

(Continued)

OTHER PUBLICATIONS

Przewlocki, H. et al., "DIASTEMOS-computerized system of IC manufacturing control and diagnostics", 1990, Elektronika, vol. 31 No. 11-12, pp. 38-40, Polish Language, (Abstract only).

(Continued)

*Primary Examiner*—Crystal J. Barnes
(74) *Attorney, Agent, or Firm*—Dugan & Dugan

(57) ABSTRACT

Methods and apparatus are provided for managing movement of small lots between processing tools within an electronic device manufacturing facility. In some embodiments, a number of priority lots to be processed is determined and an equivalent number of carrier storage locations are reserved at a substrate loading station of a processing tool. The number of reserved carrier storage locations are made available either by processing and advancing occupying non-priority lots and/or moving unprocessed occupying non-priority lots from the substrate loading station. Priority lots are then transferred to the reserved carrier storage locations. Other embodiments are provided.

18 Claims, 5 Drawing Sheets

U.S. PATENT DOCUMENTS

| | | | |
|---|---|---|---|
| 5,183,378 A | 2/1993 | Asano et al. | |
| 5,256,204 A | 10/1993 | Wu | |
| 5,372,471 A | 12/1994 | Wu | |
| 5,382,127 A | 1/1995 | Garric et al. | |
| 5,388,945 A | 2/1995 | Garric et al. | |
| 5,390,785 A | 2/1995 | Garric et al. | |
| 5,411,358 A | 5/1995 | Garric et al. | |
| 5,544,350 A | 8/1996 | Hung et al. | |
| 5,612,886 A | 3/1997 | Weng | |
| 5,668,056 A | 9/1997 | Wu et al. | |
| 5,696,689 A * | 12/1997 | Okumura et al. | 700/121 |
| 5,811,211 A | 9/1998 | Tanaka et al. | |
| 5,818,716 A | 10/1998 | Chin et al. | |
| 5,825,650 A | 10/1998 | Wang | |
| 5,884,392 A | 3/1999 | Lafond | |
| 5,888,042 A | 3/1999 | Oda | |
| 5,957,648 A | 9/1999 | Bachrach | |
| 5,971,585 A | 10/1999 | Dangat et al. | |
| 5,976,199 A | 11/1999 | Wu et al. | |
| 6,026,561 A | 2/2000 | Lafond | |
| 6,048,259 A | 4/2000 | Asai | |
| 6,050,768 A | 4/2000 | Iwasaki et al. | |
| 6,053,688 A | 4/2000 | Cheng | |
| 6,082,948 A | 7/2000 | Fishkin et al. | |
| 6,128,588 A | 10/2000 | Chacon | |
| 6,196,001 B1 | 3/2001 | Tannous et al. | |
| 6,240,335 B1 | 5/2001 | Wehrung et al. | |
| 6,415,260 B1 | 7/2002 | Yang et al. | |
| 6,431,814 B1 | 8/2002 | Christensen et al. | |
| 6,540,466 B2 | 4/2003 | Bachrach | |
| 6,587,744 B1 | 7/2003 | Stoddard et al. | |
| 6,662,076 B1 | 12/2003 | Conboy et al. | |
| 6,673,638 B1 | 1/2004 | Bendik et al. | |
| 6,684,124 B2 | 1/2004 | Schedel et al. | |
| 6,839,603 B2 * | 1/2005 | Karasawa | 700/101 |
| 2002/0094588 A1 | 7/2002 | Fan et al. | |
| 2002/0116086 A1 | 8/2002 | Huber et al. | |
| 2002/0144654 A1 | 10/2002 | Jurgen et al. | |
| 2003/0108407 A1 | 6/2003 | Ogata et al. | |
| 2004/0049398 A1 | 3/2004 | Gartland et al. | |
| 2004/0062633 A1 | 4/2004 | Rice et al. | |
| 2004/0187342 A1 | 9/2004 | Izuta | |

FOREIGN PATENT DOCUMENTS

| | | |
|---|---|---|
| EP | 0 365 589 B1 | 9/1992 |
| EP | 0 663 686 A1 | 7/1995 |
| EP | 0 850 720 A1 | 7/1998 |
| EP | 1128246 A2 | 8/2001 |
| JP | 55091839 A | 7/1980 |
| JP | 58028860 A | 2/1983 |
| JP | 60049623 A | 3/1985 |
| JP | 63234511 | 9/1988 |
| JP | 01181156 A | 7/1989 |
| JP | 01257549 A | 10/1989 |
| JP | 02015647 A | 1/1990 |
| JP | 05128131 A | 5/1993 |
| JP | 05290053 A | 11/1993 |
| JP | 06132696 | 5/1994 |
| JP | 06260545 A | 9/1994 |
| JP | 08249044 A | 9/1996 |
| JP | 09115817 A | 5/1997 |
| JP | 10135096 A | 5/1998 |
| JP | 11176717 A | 7/1999 |
| JP | 11296208 A | 10/1999 |
| JP | 2000012646 A2 | 1/2000 |
| JP | 01332464 A | 11/2001 |
| JP | 03007584 A | 1/2003 |

OTHER PUBLICATIONS

Lovell, A. M. et al., "Cell automation: integrating manufacturing with robotics", Dec. 1990, Solid State Technology, vol. 33 No. 12, p. 37-9.

Prasad, K., "A generic computer simulation model to characterize photolithography manufacturing area in an IC FAB facility", Sep. 1991, IEEE Transactions on Components, Hybrids, and Manufacturing Technology, vol. 14 No. 3, p. 483-7.

Ehteshami, B. et al., "Trade-offs in cycle time management: hot lots", May 1992, IEEE Transactions on Semiconductor Manufacturing, vol. 5, No. 2, p. 101-6.

Lou, S. et al., "Using simulation to test the robustness of various existing production control policies", 1991, 1991 Winter Simulation Conference Proceedings, IEEE, p. 261-9.

Berg, R. et al., "The formula: world class manufacturing for hybrid thin-film component production", 1992, IEEE/SEMI International Semiconductor Manufacturing Science Symposium, pp. 53-60.

Naguib, H., "The implementation of total quality management in a semiconductor manufacturing operation", 1992, IEEE/SEMI International Semiconductor Manufacturing Science Symposium, p. 63-7.

Rose, D., "Productivity enhancement", 1992, IEEE/SEMI International Semiconductor Manufacturing Science Symposium, p. 68.

Narayanan, S. et al., "Object-oriented simulation to support operator decision making in semiconductor manufacturing", 1992, 1992 IEEE International Conference on Systems, Man and Cybernetics, vol. 2, p. 1510-15.

Leonovich, G. A. et al., "Integrated cost and productivity learning in CMOS semiconductor manufacturing", Jan.-Mar. 1995, IBM Journal of Research and Development, vol. 39, No. 1-2, p. 201-13.

Leonovich, G., "An approach for optimizing WIP/cycle time/output in a semiconductor fabricator", 1994, Sixteenth IEEE/CPMT International Electronics Manufacturing Technology Symposium. 'Low-Cost Manufacturing Technologies for Tomorrow's Global Economy'. Proceedings 1994 IEMT Symposium, vol. 1, p. 108-11.

Schomig, A. K. et al., "Performance modelling of pull manufacturing systems with batch servers", 1995, Proceedings 1995 INRIA/IEEE Symposium on Emerging Technologies and Factory Automation. ETFA '95, vol. 3, p. 175-83.

Juba, R. C. et al., "Production improvements using a forward scheduler", 1996, Seventeenth IEEE/CPMT International Electronics Manufacturing Technology Symposium 'Manufacturing Technologies - Present and Future', p. 205-9.

Fuller, L. F. et al., "Improving manufacturing performance at the Rochester Institute of Technology integrated circuit factory", 1995, IEEE/SEMI 1995 Advanced Semiconductor Manufacturing Conference and Workshop. Theme - Semiconductor Manufacturing: Economic Solutions for the 21st Century. ASMC '95 Proceedings, p. 350-5.

Houmin, Yan et al., "Testing the robustness of two-boundary control policies in semiconductor manufacturing", May 1996, IEEE Transactions on Semiconductor Manfacturing, vol. 9, No. 2, p. 285-8.

Lopez, M. J. et al., "Performance models of systems of multiple cluster tools", 1996, Nineteenth IEEE/CPMT International Electronics Manufacturing Technology Symposium. Proceedings 1996 IEMT Symposium, pp. 57-65.

Collins, D. W. et al., "Implementation of Minimum Inventory Variability Scheduling 1-Step Ahead Policy(R) in a large semiconductor manufacturing facility", 1997, 1997 IEEE 6th International Conference on Emerging Technologies and Factory Automation Proceedings, pp. 497-504.

Labanowski, L., "Improving overall fabricator performance using the continuous improvement methodology", 1997, 1997 IEEE/SEMI Advanced Semiconductor Manufacturing Conference and Workshop. Theme - The Quest for Semiconductor Manufacturing Excellence: Leading the Charge into the 21st Century. ASMC Proceedings, p. 405-9.

Dudde, R. et al., "Flexible data registration and automation in semiconductor production", 1997, Proceedings of the SPIE - The International Society for Optical Engineering, p. 171-81.

Padillo, J. M. et al., "A strategic domain: IE in the semiconductor industry", Mar. 1998, IIE Solutions, pp. 36-40, 42.

Collins, D. W. et al., "Investigation of minimum inventory variability scheduling policies in a large semiconductor manufacturing facility", 1997, Proceedings of the 1997 American Control Conference, vol. 3, p. 1924-8.

Rose, O., "WIP evolution of a semiconductor factory after a bottleneck workcenter breakdown", 1998 Winter Simulation Conference. Proceedings, vol. 2, pp. 997-1003.

Iriuchijima, K. et al., "WIP allocation planning for semiconductor factories", 1998, Proceedings of the 37th IEEE Conference on Decision and Control, vol. 3, p. 2716-21.

Weiss, M., "New twists on 300 mm fab design and layout", Jul. 1999, Semiconductor International, vol. 22 No. 8, pp. 103-4, 106, 108.

Van Antwerp, K. et al., "Improving work-in-progress visibility with active product tags YASIC manufacture", Oct. 1999, Micro, vol. 17 No. 9, pp. 67-69, 72-73.

Martin, D. P., "Total operational efficiency (TOE): the determination of two capacity and cycle time components and their relationship to productivity improvements in a semiconductor manufacturing line", 1999, 10th Annual IEEE/SEMI. Advanced Semiconductor Manufacturing Conference and Workshop. ASMC 99 Proceedings, pp. 37-41.

Martin, D. P., "Capacity and cycle time-throughput understanding system (CAC-TUS) an analysis tool to determine the components of capacity and cycle time in a semiconductor manufacturing line", 1999, 10th Annual IEEE/SEMI. Advanced Semiconductor Manufacturing Conference and Workshop. ASMC 99 Proceedings, p. 127-31.

Marcoux, P. et al., "Determining capacity loss from operational and technical deployment practices in a semiconductor manufacturing line", 1999, 1999 IEEE International Symposium on Semiconductor Manufacturing Conference Proceedings, p. 3-5.

Chen, J. C. et al., "Capacity planning for a twin fab", 1999, 1999 IEEE International Symposium on Semiconductor Manufacturing Confernece Proceedings, p. 317-20.

Wei Jun-Hu et al., "Optimization methodology in simulation-based scheduling for semiconductor manufacturing", Oct. 2000, Information and Control, vol. 29, No. 5, p. 425-30, Chinese language. (Abstract only).

Hughlett, E., "Incremental levels of automation in the compound semiconductor fab", Aug. 2001, Compound Semiconductor, vol. 7, No. 7, p. 69-73.

Sarin, S. C. et al., "Reduction of average cycle time at a wafer fabrication facility", 2001, 2001 GaAs Mantech Conference. Digest of Papers, p. 241-6.

Saito, K. et al., "A simulation study on periodical priority dispatching of WIP for product-mix fabrication", 2002, 13th Annual IEEE/SEMI Advanced Semiconductor Manufacturing Conference. Advancing the Science and Technology of Semiconductor Manufacturing, ASMC 2002, p. 33-7.

Wang, J. et al., "The improvement of atuomated material handling system traffic control", 2002, 2002 Semiconductor Manufacturing Technology Workshop, p. 271-4.

Wei Jie Lee, "Optimize WIP scale through simulation approach with WIP, turn-over rate and cycle time regression analysis in semiconductor fabrication", 2002, 2002 Semiconductor Manufacturing Technology Workshop, p. 299-301.

Young Hoon Lee et al., "Push-pull production planning of the re-entrant process", 2002, International Journal of Advanced Manufacturing Technology, vol. 22, No. 11-12, p. 922-31.

Garlid, Scott C., "From philosophy to reality. Interpreting the rules of JIT for IC manufacturing", 1989, SME Technical Paper (Series) MS. Publ by SME, p. 797.

Anon, "Wafer level automation", Jan. 1995, European Semiconductor, vol. 17 No. 1, p. 2.

Anon, "Coming of fab-wide automation", May 1998, European Semiconductor Design Production Assembly, vol. 20 No. 5, p. 21-22.

Pierce, Neal G. et al., "Dynamic dispatch and graphical monitoring system", 1999 IEEE International Symposium on Semiconductor Manufacturing Conference, Proceedings 1999, p. 65-68.

Nagesh, Sukhi et al., "Intelligent second-generation MES solutions for 300mm fabs", 2000, Solid State Technology, vol. 43 No. 6, pp. 133-134, 136, 138.

"300mm single-wafer transport", Jul. 1999, Solid State Technology - semiconductor manufacturing and wafer fabrication, Semicon West '99 Product Spotlight, p. 5.

"300mm single-wafer handling", Apr. 2000, Solid State Technology, Product News, <www.sold-state.com>, p. 99.

Griessing, Juergen et al., "Assessing the feasibility of a 300-mm test and monitor wafer handeling and logistics system", Jul. 2000, Micro: The 300-mm Imperative, pp. 1-19.

"The Leading Company in Micro environment", Jan. 3, 2002, Incam Solutions Company, pp. 1-2.

"Improved wafer isolation and additional flexibility", Jan. 3, 2002, Incam Solutions Company SWIF technology, pp. 1-2.

"SEMI standards compliance" and "Related SEMI standards", Jan. 3, 2002, Incam Solutions Related standards, p. 1.

"Single Wafer Lots Solution", Jan. 3, 2002, Incam Solutions References, p. 1.

* cited by examiner

METHODS AND APPARATUS FOR MATERIAL CONTROL SYSTEM INTERFACE

The present application claims priority from U.S. Provisional Patent Application Ser. No. 60/548,588, filed Feb. 28, 2004. The content of the above-identified patent application is hereby incorporated by reference herein in its entirety.

CROSS REFERENCE TO RELATED APPLICATIONS

The present application is related to the following commonly-assigned, co-pending U.S. patent applications, each of which is hereby incorporated by reference herein in its entirety:

U.S. patent application Ser. No. 11/067,302, filed Feb. 25, 2005 and titled "METHODS AND APPARATUS FOR ENHANCED OPERATION OF SUBSTRATE CARRIER HANDLERS";

U.S. patent application Ser. No. 11/067,460, filed Feb. 25, 2005 and titled "METHODS AND APPARATUS FOR TRANSFERRING A SUBSTRATE CARRIER WITHIN AN ELECTRONIC DEVICE MANUFACTURING FACILITY";

U.S. patent application Ser. No. 11/067,303, filed Feb. 25, 2005 and titled "METHODS AND APPARATUS FOR ELECTRONIC DEVICE MANUFACTURING SYSTEM MONITORING AND CONTROL";

U.S. patent application Ser. No. 10/650,310, filed Aug. 28, 2003 and titled "SYSTEM FOR TRANSPORTING SUBSTRATE CARRIERS";

U.S. patent application Ser. No. 10/764,982, filed Jan. 26, 2004 and titled "METHODS AND APPARATUS FOR TRANSPORTING SUBSTRATE CARRIERS";

U.S. patent application Ser. No. 10/650,480, filed Aug. 28, 2003 and titled "SUBSTRATE CARRIER HANDLER THAT UNLOADS SUBSTRATE CARRIERS DIRECTLY FROM A MOVING CONVEYOR"; and U.S. patent application Ser. No. 10/987,955, filed Nov. 12, 2004 and titled "BREAK-AWAY POSITIONING CONVEYOR MOUNT FOR ACCOMMODATING CONVEYOR BELT BENDS".

FIELD OF THE INVENTION

The present invention relates generally to electronic device fabrication systems, and is more particularly concerned with transferring substrate carriers between transport systems and processing tools within a fabrication facility.

BACKGROUND OF THE INVENTION

Manufacturing of electronic devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of electronic device to be manufactured, there may be a relatively large number of processing steps required to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

For an individual substrate, the total fabrication process, from formation or receipt of the virgin substrate to cutting of semiconductor devices from the finished substrate, may require an elapsed time that is measured in weeks or months. In a typical fabrication facility, a large number of substrates may accordingly be present at any given time as "work in progress" (WIP). The substrates present in the fabrication facility as WIP may represent a very large investment of working capital, which tends to increase the per substrate manufacturing cost. It may therefore be desirable to reduce the amount of WIP for a given substrate throughput for the fabrication facility. To do so, the total elapsed time for processing each substrate should be reduced.

SUMMARY OF THE INVENTION

In a first aspect of the invention, a method is provided in which the number of priority lots to be processed is determined, an equivalent number of carrier storage locations are reserved at a substrate loading station of a processing tool, the number of reserved carrier storage locations are made available, and priority lots are transferred to the reserved carrier storage locations.

In a second aspect of the invention, an apparatus is provided in which a substrate loading station including a controller and a memory including instructions to be executed by the controller is adapted to determine a number of priority lots to be processed, reserve an equivalent number of carrier storage locations at a substrate loading station of a processing tool, make the number of reserved carrier storage locations available, and transfer priority lots to the reserved carrier storage locations.

In a third aspect of the invention, a system is provided that includes a first substrate loading station having a first processing tool and a plurality of carrier storage locations, a second substrate loading station having a second processing tool and a plurality of carrier storage locations, a transport system for moving carriers between the first and second loading stations, and a manufacturing execution system. The manufacturing execution system is operative to determine a number of priority lots to be processed, reserve a number of carrier storage locations at each of the first and second substrate loading stations wherein the number of carrier storage locations is based on the number of priority lots, make the number of reserved carrier storage locations available at each of the first and second substrate loading stations, and transfer priority lots to the reserved carrier storage locations at the first substrate loading station.

Other features and aspects of the present invention will become more fully apparent from the following detailed description of exemplary embodiments, the appended claims and the accompanying drawings.

DETAILED DESCRIPTION

Figure 1:
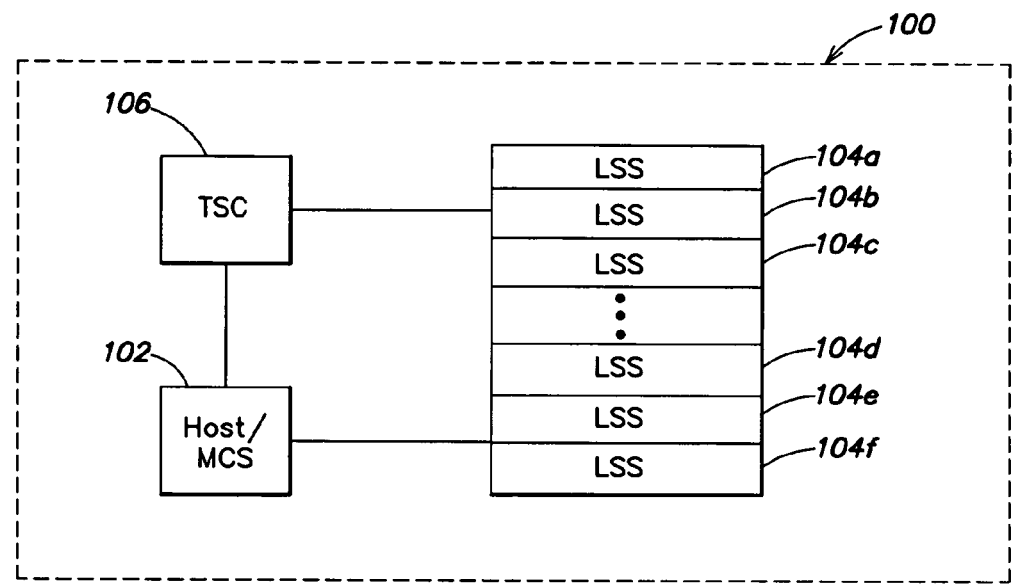
FIG. 1 is a block diagram depicting an example of a control system for an electronic device manufacturing facility according to some embodiments of the present invention.

The present invention provides methods and apparatus for expediting processing of substrate lots identified as priority lots. The features of the present invention are particularly advantageous with the use of single or small lot size substrate carriers. As used herein, the term "small lot size" substrate carrier or "small lot" carrier may refer to a carrier that is adapted to hold fewer substrates than a conventional "large lot size" carrier which typically holds thirteen or twenty-five substrates. As an example, a small lot size carrier may be adapted to hold five or less substrates. In some embodiments, other small lot size carriers may be employed (e.g., small lot size carriers that hold one, two, three, four or more than five substrates, but less than that of a large lot size carrier). In general, each small lot size carrier may hold too few substrates for human transport of carriers to be viable within an electronic device or other manufacturing facility.

A substrate loading station that serves a processing tool may include internal carrier storage locations proximate to a port of the processing tool. In operation it may be desirable to have the next lot of substrates to be processed either in carriers held in internal carrier storage locations or in a carrier ready to be transferred directly from the transport system to the port. In a system operating at near maximum capacity, the availability of internal carrier storage locations within a substrate loading station may be limited. The present invention provides methods and apparatus wherein internal carrier storage locations may be reserved for carriers containing priority lots. Carriers containing non-priority lots may be removed from the reserved locations either by transferring the non-priority lots to alternate storage locations or by processing the non-priority lots and moving the processed non-priority lots to non-reserved storage locations in a substrate loading station at a next processing tool. As the reserved internal storage locations become available, carriers containing priority substrate lots may be transferred into the reserved internal storage locations.

An electronic device manufacturing or fabrication facility (Fab) may use an overhead transport system (OHT system) that includes a plurality of carrier supports or "cradles" coupled to a continuously moving conveyor system adapted to transfer one or more substrate carriers about the facility. More specifically, the moving conveyor system may include a band and a plurality of drive motors coupled thereto, which are adapted to move the band.

Further, such a facility may include tools or composite tools adapted to process a substrate during electronic device manufacturing. Each processing tool may be coupled to a respective substrate loading station including a carrier handler adapted to transfer a substrate carrier between the tool and the moving conveyor system. More specifically, each processing tool may be coupled to a respective carrier handler adapted to transfer a substrate carrier between a load port of the processing tool and a carrier support coupled to the band of the continuously moving conveyor system. In this manner, a substrate carrier may be transferred about the facility.

In addition, a transport system may include a control system adapted to communicate with and control operation of the moving conveyor system and a plurality of carrier handlers such that substrate carriers may be moved to where they are needed. Turning to FIG. 1, a control system 100 may include a host or material control system (MCS) 102 that is in two-way communication with loading station software (LSS) 104a–f executing on each of the controllers of each of the plurality of carrier handlers housed in and/or under the control of substrate loading stations. The host may include a manufacturing execution system (MES) that directs the operations of the MCS. The MCS 102 may also be in two-way communication with a transport system controller (TSC) 106 that maintains the operation of the transport system including drive motors and the conveyor. In some embodiments, each of the LSS 104a–f nodes may communicate with the TSC 106 to directly exchange information regarding the status of the transport system. These components and their operation are described in more detail below with respect to FIG. 2.

Figure 2:
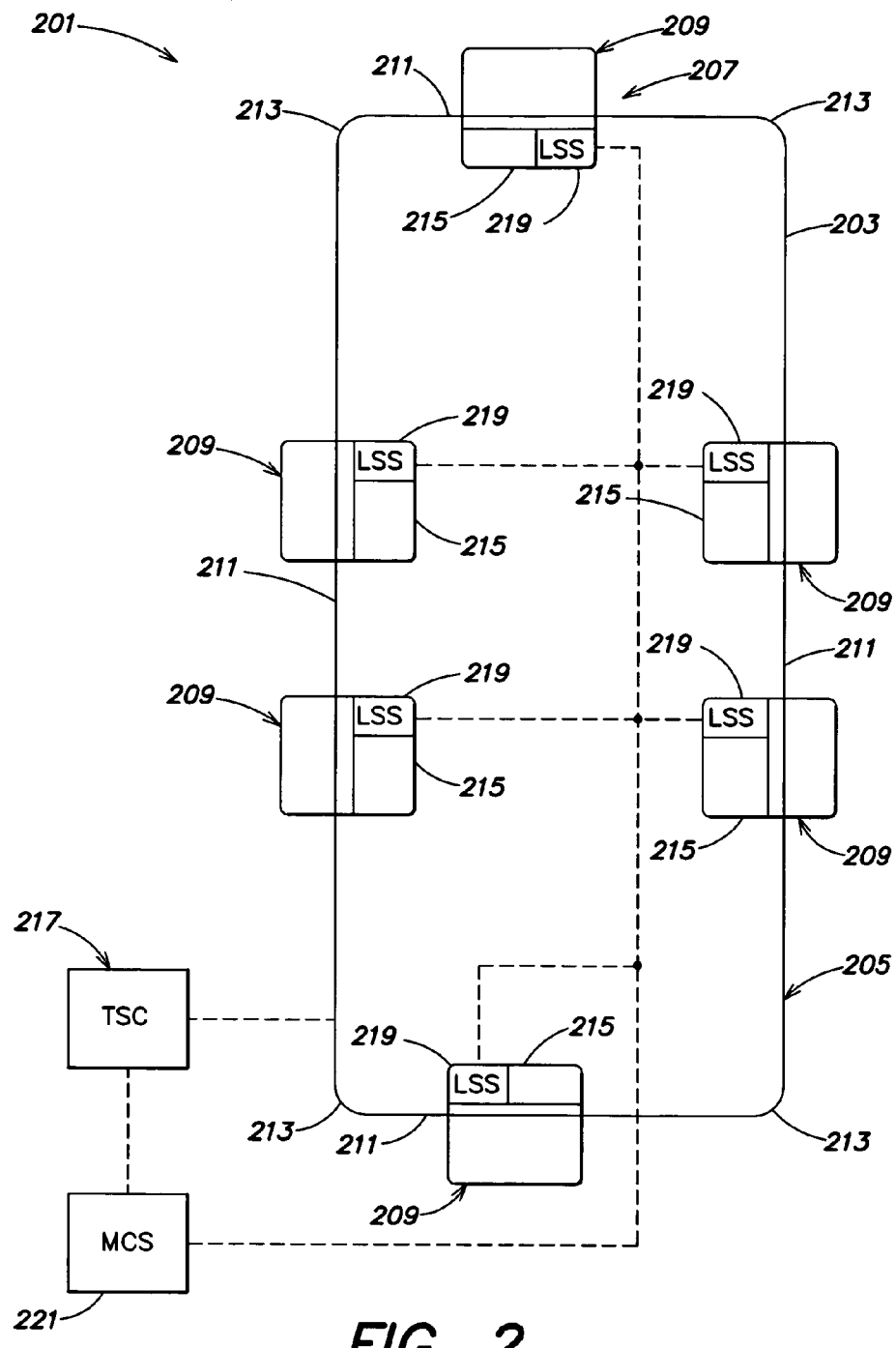
FIG. 2 is a schematic diagram depicting an example of an electronic device manufacturing facility according to some embodiments of the present invention.

Turning to FIG. 2, a schematic diagram is provided depicting an example embodiment of a physical arrangement of an example Fab 201 that is especially well suited for using small lot size substrate carriers, such as substrate carriers that hold a single substrate or fewer than twenty-five substrates. The depicted Fab 201 includes a high-speed transport system with several features that make it particularly suitable for using small lot carriers including: a high-speed, low maintenance, constantly moving conveyor system; a carrier loading/unloading function that does not require stopping or slowing the conveyor; a conveyor that is able to physically support many carriers at one time; a flexible conveyor that may be readily customized to a desired transport path; and control software adapted to efficiently manage transport and transfers between process tools. These features are described further below.

Previously incorporated U.S. patent application Ser. No. 10/650,310, filed Aug. 28, 2003 and titled "System For Transporting Substrate Carriers", discloses a substrate carrier transport system or similar delivery system that includes a conveyor for substrate carriers that is intended to be constantly in motion during operation of the Fab which it serves. The constantly moving conveyor is intended to facilitate transportation of substrates within the Fab so as to reduce the total "dwell" time of each substrate in the Fab.

To operate a Fab in this manner, methods and apparatus may be provided for unloading substrate carriers from the conveyor, and for loading substrate carriers onto the conveyor, while the conveyor is in motion. Previously incorporated U.S. patent application Ser. No. 10/650,480, filed Aug. 28, 2003 and titled "Substrate Carrier Handler That Unloads Substrate Carriers Directly From a Moving Conveyor" discloses a substrate carrier handler at a substrate loading station or "loading station" that may perform such loading/unloading operations with respect to a moving conveyor.

Figure 3:
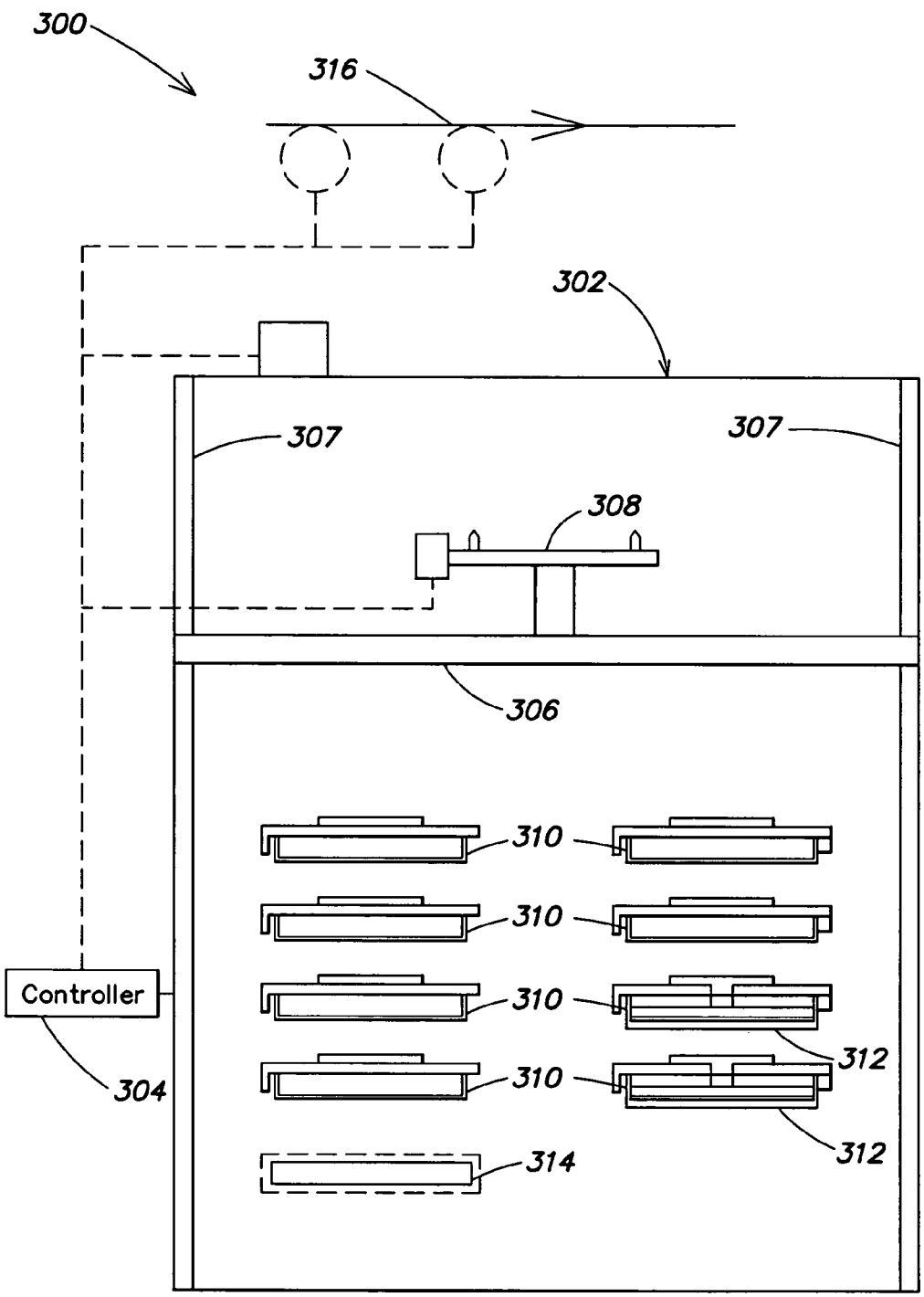
FIG. 3 is a front elevational view depicting an example of a carrier handler according to some embodiments of the present invention.

Turning to FIG. 3, a substrate loading station 300 equipped with a carrier handler 302 may include a controller 304, a horizontal guide 306 that is moveable vertically along a frame 307 or rails, and an end effector 308 that is moveable horizontally along the horizontal guide 306. Other configurations (e.g., a robot that can move in more than two dimensions) for moving the end effector 308 to execute transfers may be employed. A carrier handler 302/substrate loading station 300 may further include internal storage locations 310 or shelves/hangars for temporarily storing substrate carriers 312. In addition, ports 314 for loading substrates into process tools (not shown) may be accessible to the carrier handler 302 or be part of a substrate loading station 300 housing a carrier handler 302.

The controller 304 may be implemented using a field programmable gate array (FPGA) or other similar device. In some embodiments, discrete components may be used to implement the controller 304. The controller 304 may be adapted to control and/or monitor the operation of the substrate loading station 300 and one or more of various electrical and mechanical components and systems of the substrate loading station 300 which are described herein. The controller 304 may be adapted to execute loading station software as indicated above. In some embodiments, the controller 304 may be any suitable computer or computer system, or may include any number of computers or computer systems.

In some embodiments, the controller 304 may be or may include any components or devices which are typically used by, or used in connection with, a computer or computer system. Although not explicitly pictured in FIG. 3, the controller 304 may include one or more central processing units, read only memory (ROM) devices and/or a random access memory (RAM) devices. The controller 304 may also include input devices such as a keyboard and/or a mouse or other pointing device, and output devices such as a printer or other device via which data and/or information may be obtained, and/or a display device such as a monitor for displaying information to a user or operator. The controller 304 may also include a transmitter and/or a receiver such as a LAN adapter or communications port for facilitating communication with other system components and/or in a network environment, one or more databases for storing any appropriate data and/or information, one or more programs or sets of instructions for executing methods of the present invention, and/or any other computer components or systems, including any peripheral devices.

According to some embodiments of the present invention, instructions of a program (e.g., controller software) may be read into a memory of the controller 304 from another medium, such as from a ROM device to a RAM device or from a LAN adapter to a RAM device. Execution of sequences of the instructions in the program may cause the controller 304 to perform one or more of the process steps described herein. In alternative embodiments, hard-wired circuitry or integrated circuits may be used in place of, or in combination with, software instructions for implementation of the processes of the present invention. Thus, embodiments of the present invention are not limited to any specific combination of hardware, firmware, and/or software. The memory may store the software for the controller which may be adapted to execute the software program, and thereby operate in accordance with the present invention, and particularly in accordance with the methods described in detail below. Portions of the present invention may be embodied as a program developed using an object oriented language that allows the modeling of complex systems with modular objects to create abstractions that are representative of real world, physical objects and their interrelationships. However, it would be understood by one of ordinary skill in the art that the invention as described herein can be implemented in many different ways using a wide range of programming techniques as well as general purpose hardware sub-systems or dedicated controllers.

The program may be stored in a compressed, uncompiled and/or encrypted format. The program furthermore may include program elements that may be generally useful, such as an operating system, a database management system and device drivers for allowing the controller to interface with computer peripheral devices and other equipment/components. Appropriate general purpose program elements are known to those skilled in the art, and need not be described in detail herein.

As indicated above, the controller 304 may generate, receive, and/or store databases including data related to carrier locations, command queues, actual and/or estimated command execution times, and/or internal storage locations. As will be understood by those skilled in the art, the schematic illustrations and accompanying descriptions of the structures and relationships presented herein are merely exemplary arrangements. Any number of other arrangements may be employed besides those suggested by the illustrations provided.

In operation, to unload a substrate carrier 312 from a transport system 316 that includes a moving conveyor that transfers substrate carriers 312 (also referred to as a "substrate carrier conveyor" 316) and that passes by the carrier handler 302, the end effector 308 is moved horizontally at a velocity that substantially matches the velocity of the substrate carrier 312 as it is being transported by the substrate carrier conveyor 316 (e.g., by substantially matching substrate carrier speed in a horizontal direction). In addition, the end effector 308 may be maintained in a position adjacent the substrate carrier 312 as the substrate carrier 312 is being transported. The end effector 308 thus may substantially match a position of the substrate carrier 312 while substantially matching a velocity of the substrate carrier 312. Likewise, conveyor position and/or velocity may be substantially matched.

While the end effector 308 substantially matches the substrate carrier's velocity (and/or position), the end effector 308 is raised so that the end effector 308 contacts the substrate carrier 312 and disengages the substrate carrier 312 from the substrate carrier conveyor 316. A substrate carrier 312 similarly may be loaded onto the moving substrate carrier conveyor 316 by substantially matching end effector 308 and conveyor velocities (and/or positions) during loading. In at least one embodiment, such substrate carrier handoffs between the end effector 308 and substrate carrier conveyor 316 are performed at a substantially zero velocity and/or acceleration difference between the end effector 308 and the substrate carrier conveyor 316.

Previously incorporated U.S. patent application Ser. No. 10/764,982, filed Jan. 26, 2004 and titled "Methods and Apparatus for Transporting Substrate Carriers", describes a conveyor system that may be employed with the above-described substrate carrier transport system 316 and/or carrier handler 302 for transporting substrate carriers between one or more processing tools of a electronic device manufacturing facility. The conveyor system may include a ribbon (or "band") that forms a closed loop within at least a portion of the electronic device manufacturing facility and that transports substrate carriers therein. In one or more embodiments, the ribbon or band may be formed from stainless steel, polycarbonate, composite materials (e.g., carbon graphite, fiberglass, etc.), steel or otherwise reinforced polyurethane, epoxy laminates, plastic or polymer materials that include stainless steel, fabric (e.g., carbon fiber, fiberglass, Kevlar® available from Dupont, polyethylene, steel mesh, etc.) or another stiffening material, etc. By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the conveyor to be constructed and implemented inexpensively. For example, the ribbon requires little material to construct, is easy to fabricate and, due to its vertical rigidity/strength, can support the weight of numerous substrate carriers without supplemental support structure (such as rollers or other similar mechanisms used in conventional, horizontally-oriented belt-type conveyor systems). Furthermore, the conveyor system is highly customizable because the ribbon may be bent, bowed or otherwise shaped into numerous configurations due to its lateral flexibility.

Turning back to FIG. 2, the example Fab 201 includes a ribbon or band 203 that forms a simple loop 205 within the Fab 201. The ribbon 203 may comprise, for example, one of the ribbons described in previously incorporated U.S. patent application Ser. No. 10/764,982. The ribbon 203 transports substrate carriers (not shown) between processing tools 209, and comprises straight portions 211 and curved portions 213 to form the (closed) loop 205. Other number of processing tools 209 and/or loop configurations may be employed.

Each processing tool 209 may include a substrate carrier handler at a substrate loading station or "loading station" 215 of the processing tool 209 for unloading a substrate carrier from or for loading a substrate carrier onto the moving ribbon 203 of the conveyor system 207 as the ribbon 203 passes by the loading station 215 (as described in previously incorporated U.S. patent application Ser. No. 10/650,480). For example, an end effector 308 (FIG. 3) of a loading station 215 may be moved horizontally at a velocity that substantially matches the velocity of the substrate carrier as it is being transported by the ribbon 203, maintained in a position adjacent the substrate carrier as the substrate carrier is being transported and raised so that the end effector contacts the substrate carrier and disengages the substrate carrier from the conveyor system 207. A substrate carrier similarly may be loaded onto the moving ribbon 203 by substantially matching end effector 308 (FIG. 3) and ribbon velocities (and/or positions) during loading.

Each loading station 215 may include one or more ports (e.g., load ports) or similar locations where substrates or substrate carriers are placed for transfer to and/or from a processing tool 209 (e.g., one or more docking stations, although transfer locations that do not employ docking/undocking movement may be employed). Various substrate carrier storage locations or shelves also may be provided at each loading station 215 for substrate carrier buffering at a processing tool 209.

The conveyor system 207 may include a transport system controller (TSC) 217 for controlling operation of the ribbon 203. For example the TSC 217 may control/monitor the speed and/or status of the ribbon 203, allocate carrier supports of the ribbon 203 that are used to support/transport substrate carriers, monitor the status of such carrier supports, provide such information to each loading station 215 or the like. Likewise, each loading station 215 may include LSS 219 for controlling carrier handler operation (e.g., loading or unloading of substrate carriers to/from the conveyor system 207, transporting of substrate carriers to/from load ports or storage locations of the loading station 215 and/or processing tool 209 serviced by the loading station 215, etc.). A MCS 221 communicates with the transport system controller 217 and the loading station software 219 of each substrate loading station 215 for affecting operation of the same. The TSC 217, each LSS 219 and/or the MCS 221 may include a scheduler (not shown) for controlling scheduling of the operations performed by the TSC 217, LSS 219 and/or the MCS 221.

PROCESS DESCRIPTIONS

The system discussed above, including the hardware and software components, are useful to perform the methods of the invention. However, it should be understood that not all of the above described components are necessary to perform any of the present invention's methods. In fact, in some embodiments, none of the above described system is required to practice the present invention's methods. The system described above is an example of a system that would be useful in practicing the invention's methods and is especially well suited for transferring small lot size substrate carriers, such as substrate carriers that hold a single substrate or substantially fewer than twenty-five substrates.

In a conventional FAB operation, a lot is moved to a stocker that services a bay. When a processing tool load port becomes available, the manufacturing execution system is notified with a "move in request" (MIR) message (e.g., a message from a tool controller, for example, that indicates that the tool load port is available). The MES then selects the next lot for processing in the tool. The lot is moved to the tool where processing begins. The MES is notified with a "move out request" (MOR) message once processing of the lot is complete (e.g., a message that indicates that the contents of a substrate carrier have been processed within the tool). The MES determines what the next process step is for the lot and stores the lot in a stocker that services the bay for, among others, the next process tool.

In a Fab equipped for single substrate and/or small lot processing, modifications to the conventional operation described above may be employed to improve throughput of the Fab in accordance with the present invention. For example, in some embodiments, when processing of a small lot (or single substrate) is completed, the MES may determine the next processing tool to which the small lot carrier is to be sent, as opposed to conventional large lot operation wherein the carrier would be sent to a buffer stocker to await being requested by the next processing tool. This is because in embodiments of the present invention, the MES is aware that the substrate loading station is equipped with internal storage locations and able to stage lots for the associated processing tool.

In another example, buffer stockers may be used by the MCS and/or substrate loading station as an alternate storage location. The MCS may include a list of alternate storage locations. In some embodiments, the list of alternate storage locations may be configurable by an operator. In alternative and additional embodiments, an algorithm implemented as a program may be used to select a preferred storage location from the list based upon a location's available storage capacity and/or proximity to the substrate loading station that requested the carrier be moved to an alternate storage location. In some embodiments, carriers stored in alternate storage locations may be moved automatically by the MCS to the substrate loading station that requested the carrier be moved to an alternate storage location as internal storage becomes available. Such carriers may be moved in an order based upon a priority of the individual carriers that reflects how soon the substrate loading station can use the carriers.

Figure 4:
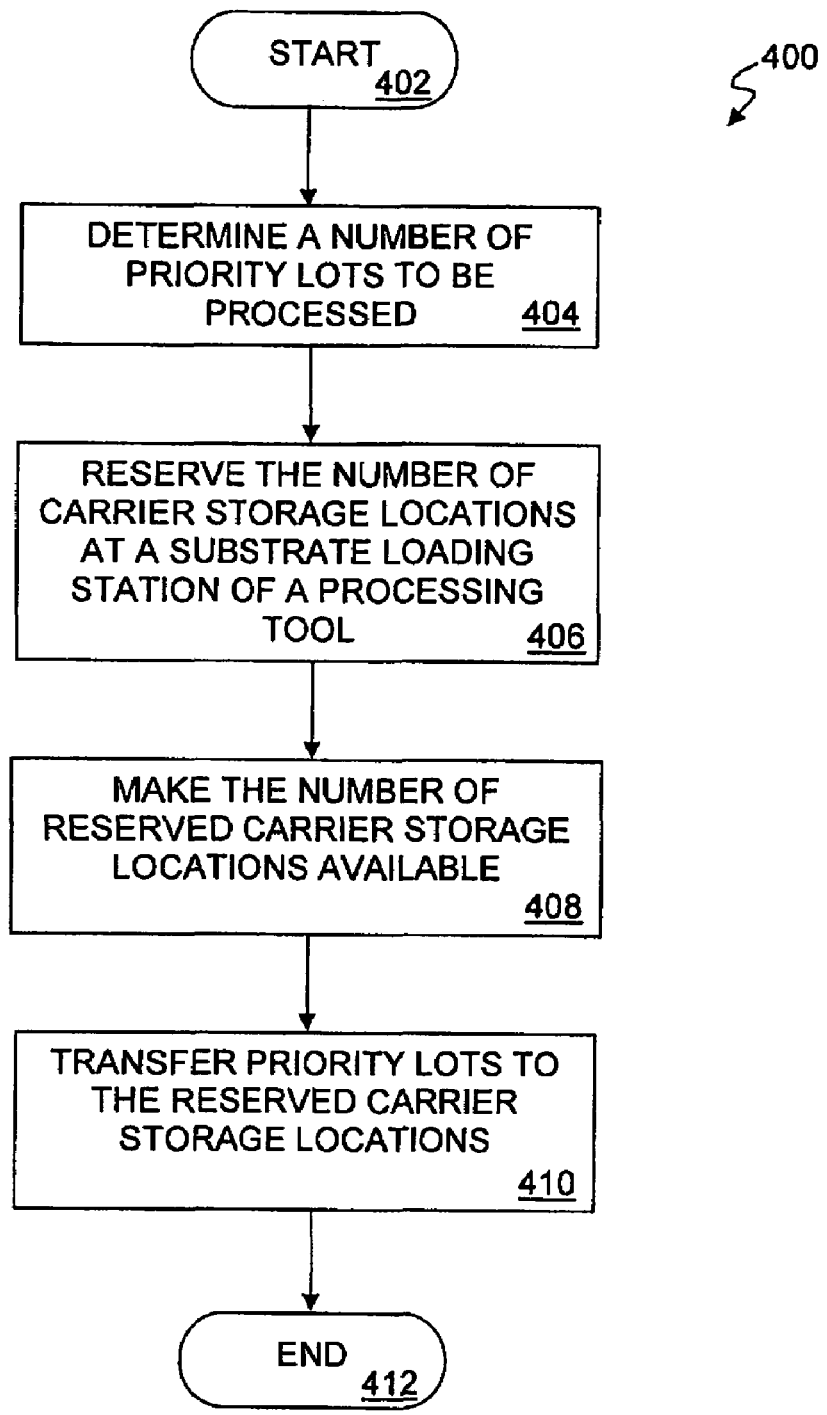
FIG. 4 is a flowchart depicting an example process for managing priority lots in a transport system according to some embodiments of the present invention.

Referring to FIG. 4, a flowchart is depicted that represents some specific example embodiments of the present invention that may be performed using the systems described above. It must be understood that the particular arrangement of elements in the flowchart of FIG. 4, as well as the number and order of example steps of various methods discussed herein, is not meant to imply a fixed order, sequence, quantity, and/or timing to the steps; embodiments of the present invention can be practiced in any order, sequence, and/or timing that is practicable.

In the text that follows, method steps will be discussed in detail. Note that not all of these steps are required to perform the methods of the present invention and that additional and/or alternative steps are also discussed below. Also note that the general steps depicted in the flowcharts represent features of only some of the embodiments of the present invention and that they may be re-ordered, combined and/or subdivided in any number of different ways so that methods of the present invention include more or fewer actual steps. For example, in some embodiments many additional steps may be added to update and maintain databases described below, but as indicated, it is not necessary to use such databases in all embodiments of the invention. In other words, the methods of the present invention may contain any number of steps that are practicable to implement the several different inventive processes described herein.

As indicated above, the MCS 221 is responsible for delivery and storage of carriers in a bay, by sending commands to various equipment, which include substrate loading stations/carrier handlers and transfer stations (equipment that may perform conveyor band to band transfers, not shown herein). In some embodiments, certain aspects of the carrier handler may me implemented in conformance with an industry standard entitled the SEMI E88-1103 standard "Specification for AMHS Storage SEM (Stocker SEM)", which in particular details standardized commands and protocols for control of compliant devices. Likewise, a transport system controller (TSC) 117, which is responsible for controlling conveyor operation, may be implemented in conformance with the SEMI E82-0703 standard "Specification for Interbay/Intrabay AMHS SEM (IBSEM)". Interactions with a tool's port may me implemented in conformance with the SEMI E84-0703 standard "Specification for Enhanced Carrier Handoff Parallel I/O Interface" and handling of carriers may be implemented in conformance with the SEMI E87-0703 standard "Specification for Carrier Management (CMS)". These four standards are published by the Semiconductor Equipment and Materials International (SEMI) industry coalition group of San Jose, Calif. (www.semi.org) and are hereby incorporated herein by reference for all purposes.

Turning to FIG. 4, a flowchart depicting an example process 400 for managing priority lots in a transport system is provided. The process 400 begins at step 402. In step 404, the number of priority lots to be processed is determined. In some embodiments, an operator may specify to the MES the number of priority lots that are to receive expedited processing. The MES may indicate to the MCS that the specified number of carriers containing the priority lots are to be processed as soon as possible and delivered to substrate loading stations before non-priority lots. In some embodiments, priority lots may be expedited individually (e.g., a single carrier may contain the priority lot) and step 404 may not be required.

In step 406, the MCS may activate a priority lot processing mode and direct each substrate loading station associated with a processing tool that is to process the priority lot, to reserve the appropriate number of internal carrier storage locations within the respective substrate loading station. The MCS may thus include logic (e.g., an algorithm implemented as a program) to identify and select specific internal storage locations within a substrate loading station that, for example, are storing carriers with substrates that can be processed quickly (e.g., relative to other carrier's substrates) and/or substrates that will not be processed for a long time (e.g., relative to other carrier's substrates). In some embodiments, the individual substrate loading stations may make the selection of storage locations to reserve for storage of the priority lots.

In additional or alternative embodiments, the number of internal carrier storage locations that are reserved may be based on the number of priority lots and/or the number of priority lots that are anticipated to be present in a substrate loading station at one time. In other words, the number of reserved locations may be equal to or less than the number of priority lots moving through the system. For example, if there are fifteen priority lots, it may be that only ten carrier storage locations may need to be reserved because, e.g., by the time ten priority lot carriers have been moved into the substrate loading station's storage locations, five priority lots may have already been processed and removed from the substrate loading station. In some embodiments, the number of reserved locations may be greater than the number of priority lots. For example, lots may be assigned different levels of priority relative to each other and some substrate loading stations may reserve a fixed number of storage locations for higher priority lots. In some embodiments, one or more ports for a processing tool within a substrate loading station may be reserved for use with priority lots.

In step 408, the MCS and/or each of the relevant substrate loading stations may make the respective number of reserved internal carrier storage locations available for use with the priority lots. In some embodiments, non-priority lots occupying reserved locations may be transferred to alternate storage locations, for example, at other substrate loading stations or stockers associated with the transport system. Alternatively, or in addition, non-priority lots occupying reserved locations may be processed by the tool served by the substrate loading station and then transferred to a non-reserved storage location within a next substrate loading station serving a next processing tool. Carriers containing non-priority lots that continue to arrive at the substrate loading station are prevented from being stored in the reserved storage locations. Non-priority lots are either stored in any available non-reserved storage locations or transferred to alternative storage locations in other substrate loading stations or buffer stockers.

To facilitate making reserved locations available by processing and advancing non-priority lots and/or putting non-priority lots into alternate storage, lot selection scheduling by the MES may be modified from a conventional scheduling algorithm. The MES may store information about the total capacity of each substrate loading station and the number of carriers currently stored at each substrate loading station. From this information, the MES may determine which lots need to be moved or processed on the particular tool requiring internal storage locations to be made available. In some embodiments, priority lots may be stored temporarily in alternate storage locations awaiting the availability of reserved locations and then be automatically moved to the reserved locations as non-priority lots are removed.

In step 410, the carriers containing the priority lots may be transferred to the reserved internal carrier storage locations within the substrate loading station serving the processing tool to which such carriers are destined. In some embodiments, the priority lots may be transferred into the reserved storage locations as soon as each reserved storage location becomes available. At this point, any newly arriving non-priority lots may only be transferred into the substrate loading station if a non-reserved internal storage location becomes available. In step 412, the process 400 completes.

Although not pictured in FIG. 4, in some embodiments, as soon as processing begins on the final priority lot in a processing tool, the reserved storage locations may be made available for storing non-priority lots, either from the alternate storage locations or newly arriving. In alternative and/or additional embodiments, as the number of priority lots at a substrate loading station incrementally decreases after each lot is processed and then moved to a next substrate loading station, the number of reserved storage locations may be incrementally decreased.

Figure 5:
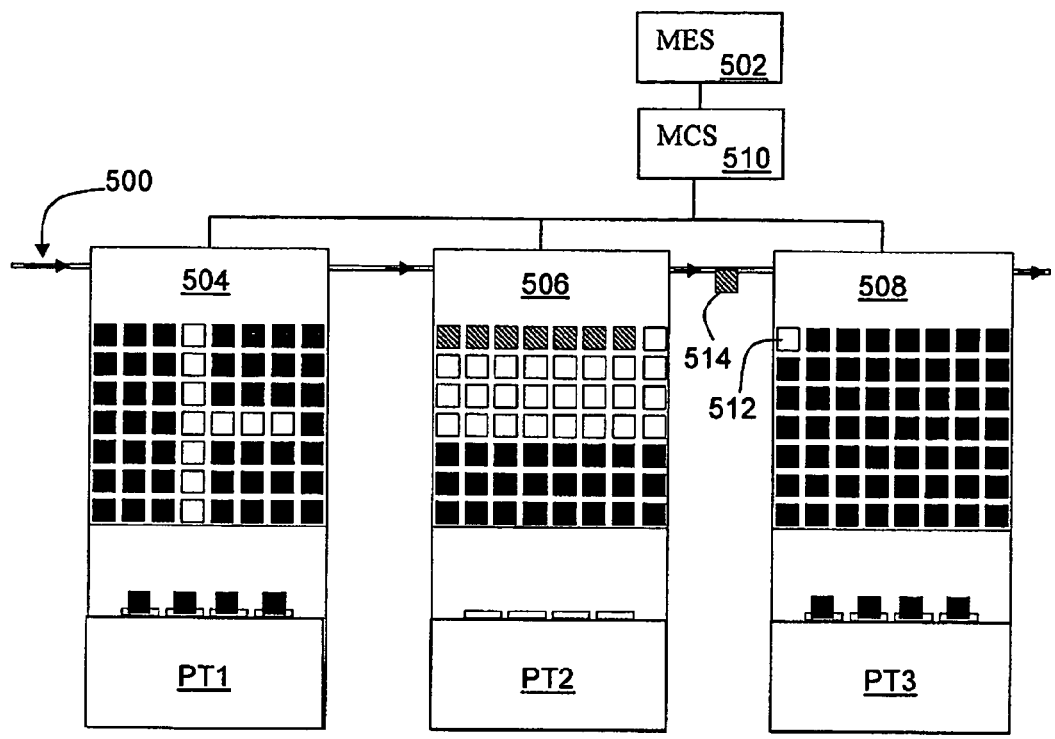
FIG. 5 is a schematic diagram depicting example operation of an electronic device manufacturing facility according to some embodiments of the present invention.

In contrast to FIG. 4, FIG. 5 depicts a moment of operation of an embodiment of the present invention, operating without the use of priority lots. More specifically, operation of a transport'system 500 including a MES 502 and three substrate loading stations 504, 506, 508 serving associated processing tools PT1, PT2, PT3, respectively under a heavy throughput condition is depicted. When processing of a lot completes on a processing tool, the MES 502 determines the next best process tool for the lot. In the example, processing tool PT3 was selected. Solid squares represent lots waiting to be processed, empty squares represent empty storage locations, and striped squares represent lots that are (or were) in alternate storage locations. Before the moment depicted in FIG. 5, the MES 502 may have sent a transfer command to an MCS 510 to move the lot processed at processing tool PT1 to processing tool PT3. However, the MCS 510 may have determined that internal storage was not available in processing tool PT3, so the lot was stored in alternate storage in processing tool PT2. Processing tool PT2 may have been chosen because processing tool PT2 was the first device in an alternate storage list of processing tool PT3 that had storage capacity at the time.

The specific moment depicted in FIG. 5 shows a storage space 512 that has become available in processing tool PT3 and a lot 514 designated for processing tool PT3 (previously stored in an alternate location in processing tool PT2) being automatically moved on the transport system 500 under the direction of the MCS 510 to the available storage location 512 in processing tool PT3. Because in this example, all lots have the same priority, there are no conflicts and needed lots will be in processing tool PT3 when "move in requests" for the lots are issued.

The foregoing description discloses only particular embodiments of the invention; modifications of the above disclosed methods and apparatus which fall within the scope of the invention will be readily apparent to those of ordinary skill in the art. For instance, it will be understood that the invention also may be employed with any type of substrates such as a silicon substrate, a glass plate, a mask, a reticule, a wafer, etc., whether patterned or unpatterned; and/or with apparatus for transporting and/or processing such substrates.

Accordingly, while the present invention has been disclosed in connection with specific embodiments thereof, it should be understood that other embodiments may fall within the spirit and scope of the invention, as defined by the following claims.

The invention claimed is:

1. A method comprising:
   determining a number of priority lots to be processed;
   reserving a number of carrier storage locations at a substrate loading station of a processing tool, wherein the number of carrier storage locations is based on the number of priority lots;
   making the number of reserved carrier storage locations available; and
   transferring priority lots to the reserved carrier storage locations,
   wherein determining a number of priority lots to be processed includes receiving a signal representative of the number of priority lots to be processed.

2. The method of claim 1 wherein reserving the number of carrier storage locations at a substrate loading station of a processing tool includes identifying enough carrier storage locations sufficient to store the number of priority lots to be processed.

3. The method of claim 1 wherein making the number of reserved carrier storage locations available includes processing non-priority lots of substrates in carriers occupying the reserved carrier storage locations.

4. The method of claim 3 further comprising moving carriers containing processed lots and occupying the reserved carrier storage locations to carrier storage locations associated with a next processing tool.

5. The method of claim 1 wherein making the number of reserved carrier storage locations available includes moving carriers occupying the reserved carrier storage locations to alternate carrier storage locations and preventing any carriers arriving at the substrate loading station, containing only non-priority lots, from occupying the reserved carrier storage locations.

6. The method of claim 1 wherein transferring priority lots to the reserved storage locations includes transferring only priority lots to the reserved storage locations as the reserved storage locations become available.

7. An apparatus comprising:
   a substrate loading station including a controller; and
   a memory including instructions to be executed by the controller and adapted to:
      determine a number of priority lots to be processed;
      reserve a number of carrier storage locations at a substrate loading station of a processing tool, wherein the number of carrier storage locations is based on the number of priority lots;
      make the number of reserved carrier storage locations available; and
      transfer priority lots to the reserved carrier storage locations,
   wherein the instructions adapted to determine a number of priority lots to be processed are further adapted to receive a signal representative of the number of priority lots to be processed.

8. The apparatus of claim 7 wherein the instruction adapted to reserve the number of carrier storage locations at a substrate loading station of a processing tool is further adapted to identify enough carrier storage locations sufficient to store the number of priority lots to be processed.

9. The apparatus of claim 7 wherein the instruction adapted to make the number of reserved carrier storage locations available is further adapted to process substrates in carriers occupying the reserved carrier storage locations.

10. The apparatus of claim 9 further including an instruction adapted to move carriers containing processed lots and occupying the reserved carrier storage locations to carrier storage locations associated with a next processing tool.

11. The apparatus of claim 7 wherein the instruction adapted to make the number of reserved carrier storage locations available is further adapted to move carriers occupying the reserved carrier storage locations to alternate carrier storage locations.

12. The apparatus of claim 7 wherein the instruction adapted to transfer priority lots to the reserved storage locations is further adapted to transfer priority lots to the reserved storage locations as the reserved storage locations become available.

13. A system comprising:
   a first substrate loading station having a first processing tool and a plurality of carrier storage locations;
   a second substrate loading station having a second processing tool and a plurality of carrier storage locations;
   a transport system for moving carriers between the first and second loading stations; and
   a manufacturing execution system operative to:
      determine a number of priority lots to be processed,
      reserve a number of carrier storage locations at each of the first and second substrate loading stations, wherein the number of carrier storage locations is based on the number of priority lots,
      make the number of reserved carrier storage locations available at each of the first and second substrate loading stations, and
      transfer priority lots to the reserved carrier storage locations at the tirst substrate loading station,
   wherein the manufacturing execution system is further operative to receive a signal representative of the number of priority lots to be processed in order to determine the number of priority lots to be processed.

14. The system of claim 13 wherein the manufacturing execution system is further operative to identify enough carrier storage locations at each of the first and second substrate loading stations sufficient to store the number of priority lots to be processed at each processing tool in order to reserve the number of carrier storage locations at each of the first and second substrate loading stations.

15. The system of claim 13 wherein the manufacturing execution system is further operative to cause the fist and second processing tools to process non-priority lots of substrates in carriers occupying the reserved carrier storage locations in order to make the number of reserved carrier storage locations available at each of the first and second substrate loading stations.

16. The system of claim 15 further comprising moving carriers containing non-priority lots of substrates processed at the fist processing tool and occupying the reserved carrier storage locations in the first substrate loading station to carrier storage locations in the second substrate loading station that are not reserved.

17. The system of claim 13 wherein the manufacturing execution system is further operative to cause carriers containing non-priority lots and occupying the reserved carrier storage locations to be moved to alternate carrier storage locations in order to make the number of reserved carrier storage locations available at each of the first and second substrate loading stations.

18. The system of claim 13 wherein the manufacturing execution system is further operative to cause priority lots to be transferred to the reserved storage locations as the reserved storage locations become available.

* * * * *